US011133204B2

(12) United States Patent
Hao et al.

(10) Patent No.: US 11,133,204 B2
(45) Date of Patent: Sep. 28, 2021

(54) CHAMBER MATCHING WITH NEURAL NETWORKS IN SEMICONDUCTOR EQUIPMENT TOOLS

(71) Applicant: Applied Materials, Inc., Santa Clara, CA (US)

(72) Inventors: Heng Hao, Fremont, CA (US); Tianqing Liao, Mountain View, CA (US); Sima Didari, San Jose, CA (US); Harikrishnan Rajagopal, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 354 days.

(21) Appl. No.: 16/261,041

(22) Filed: Jan. 29, 2019

(65) Prior Publication Data

US 2020/0243359 A1 Jul. 30, 2020

(51) Int. Cl.
*H01L 21/67* (2006.01)
*H01J 37/32* (2006.01)

(52) U.S. Cl.
CPC .. *H01L 21/67253* (2013.01); *H01J 37/32935* (2013.01)

(58) Field of Classification Search
CPC ........... G05B 2219/32187; G05B 2219/32194; G05B 19/19; H01L 22/20
See application file for complete search history.

(56) References Cited

U.S. PATENT DOCUMENTS

| 7,062,411 | B2 * | 6/2006 | Hopkins | ................. C23C 16/52 324/512 |
| 7,624,003 | B2 | 11/2009 | Yamartino | |
| 10,671,056 | B2 * | 6/2020 | Nakayama | ......... G05B 23/0235 |
| 10,747,210 | B2 * | 8/2020 | Unterguggenberger | ..................... G05B 19/41865 |

(Continued)

FOREIGN PATENT DOCUMENTS

KR 101094598 B1 12/2011

OTHER PUBLICATIONS

PCT Notification of Transmittal of the International Search Report and the Written Opinion of the International Searching Authority for International Application No. PCT/US2020/012416; dated May 7, 2020; 10 total pages.

*Primary Examiner* — Jaehwan Oh
(74) *Attorney, Agent, or Firm* — Patterson + Sheridan, LLP

(57) ABSTRACT

A server trains a neural network by feeding a first set of input time-series data of one or more sensors of a first processing chamber that is within specification to the neural network to produce a corresponding first set of output time-series data. The server calculates a first error. The server feeds a second set of input time-series data from corresponding one or more sensors associated with a second processing chamber under test to the trained neural network to produce a corresponding second set of output time-series data. The server calculates a second error. Responsive to the difference between a second error between the second set of input time-series data (Continued)

and the corresponding second set of output time-series data and a first error between the first set of input time-series data and the corresponding first set of output time-series data being equal to or exceeding a threshold amount, the server declares that the second processing chamber under test mismatches the first processing chamber that is within specifications.

20 Claims, 9 Drawing Sheets

(56) References Cited

U.S. PATENT DOCUMENTS

| | | | |
|---|---|---|---|
| 2005/0001996 A1 | 1/2005 | Wu | |
| 2006/0155410 A1 | 7/2006 | Yamartino | |
| 2007/0249071 A1 | 10/2007 | Lian et al. | |
| 2009/0030632 A1 | 1/2009 | Tallavarjula et al. | |
| 2009/0240366 A1* | 9/2009 | Kaushal | G06N 5/04 |
| | | | 700/110 |
| 2012/0242667 A1* | 9/2012 | Kaushal | G05B 13/0265 |
| | | | 345/440 |
| 2014/0100806 A1* | 4/2014 | Good | G05B 23/0237 |
| | | | 702/82 |
| 2014/0304196 A1 | 10/2014 | Kaushal et al. | |
| 2018/0015865 A1 | 1/2018 | Varonier et al. | |
| 2020/0082245 A1* | 3/2020 | Hao | G06N 3/04 |

* cited by examiner

CHAMBER MATCHING WITH NEURAL NETWORKS IN SEMICONDUCTOR EQUIPMENT TOOLS

BACKGROUND

Field

Implementations described herein generally relate to analyzing time-series traces to detect mismatches between a semiconductor processing chamber under test and a corresponding semiconductor processing chamber known to be within specifications.

Description of the Related Art

Within the semiconductor industry, an ever present need exists for improved process repeatability and control. As new generations of integrated circuits employ smaller feature sizes than were contemplated in previous generations, greater demands are placed on the integrated circuit fabrication process. Deposition and etching one or more layers of a semiconductor substrate in a plasma environment are two of the most common steps in integrated circuit manufacturing. To ensure that a correct quantity and quality of film is deposited or etched, the plasma state of the process chamber needs to be monitored comprehensively prior to, during and after production substrate processing. Comprehensive chamber monitoring prior to production substrate processing allows proper chamber qualification to be conducted. Comprehensive chamber monitoring during production substrate processing allows correct endpoint and fault detection. Comprehensive chamber monitoring after production substrate processing allows diagnosis of source of fault, if faults were detected during substrate processing.

To ensure that a correct amount and quality of film is deposited or etched, a process chamber needs to be monitored and be compared to a "reference" chamber ("good" chamber or "golden" chamber). The procedure used to compare chambers is sometimes called chamber matching. Chamber matching is a condition where the output of one or more processing chambers, in terms of properties of devices produced, are exactly matched within the specification. In semiconductor manufacturing, the production processing equipment used is controlled such that its variables stay within certain operational limits. These limits can be very narrow and typically vary throughout the different steps, stages or phases of the process. Failure to remain within these operational limits during processing can easily cause the loss of, or damage to, the device and/or wafer being processed.

Chamber matching procedures are used at various times during a chamber's use. When a process chamber is newly manufactured, the chamber needs to be qualified, which typically includes matching. Once the chamber is matched, the chamber can then be shipped to a semiconductor manufacturing facility. Once the chamber arrives at the semiconductor manufacturing facility, the chamber is reassembled and "qualified" again prior to processing the production materials. In addition, in a semiconductor manufacturing facility, a plasma deposition or etching chamber can potentially be used to run different process recipes for different substrates. Before a process recipe is changed, the chamber usually needs to be "matched" again to ensure the chamber is operating normally before the process recipe change occurs. Lastly, production chambers must undergo regular maintenance or cleaning. After maintenance or chamber cleaning, the chamber needs to be "matched" again prior to running production wafers. For new generation semiconductor manufacturing, stringent chamber matching techniques that utilize comprehensive plasma monitoring are needed to ensure process repeatability and control.

Most of the current chamber matching techniques require a deep understanding of the chamber to be able to perform complex feature engineering on the multi-variant sensor data, and thus suffer by being too recipe dependent, too slow to scale up and too expensive to develop and maintain. Moreover, most of the current techniques cannot handle multi-chamber matching at the same time.

Therefore, a need exists for a method to provide more accurate way of chamber matching.

SUMMARY

A method for matching processing chambers that process semiconductor substrate is disclosed. In one implementation, the method includes training a neural network by feeding a first set of input time-series data of one or more sensors of a first processing chamber that is within specification to the neural network to produce a corresponding first set of output time-series data. The method further includes calculating a first error between the first set of input time-series data and the corresponding first set of output time-series data. The method further includes feeding a second set of input time-series data from corresponding one or more sensors associated with a second processing chamber under test to the trained neural network to produce a corresponding second set of output time-series data. The method further includes calculating a second error between the second set of input time-series data and the corresponding second set of output time-series data. The method further includes, responsive to the difference between the second error and the first error being equal to or exceeding a threshold amount, declaring that the second processing chamber under test mismatches the first processing chamber that is within specifications In another implementation, a computer system is provided, which comprises a memory and a processor configured to perform a method for matching processing chambers that process semiconductor substrates. The computer system trains a neural network by feeding a first set of input time-series data of one or more sensors of a first processing chamber that is within specification to the neural network to produce a corresponding first set of output time-series data. The computer system calculates a first error between the first set of input time-series data and the corresponding first set of output time-series data. The computer system feeds a second set of input time-series data from corresponding one or more sensors associated with a second processing chamber under test to the trained neural network to produce a corresponding second set of output time-series data. The computer system calculates a second error between the second set of input time-series data and the corresponding second set of output time-series data. Responsive to the difference between the second error and the first error being equal to or exceeding a threshold amount, the computer system declares that the second processing chamber under test mismatches the first processing chamber that is within specifications.

In yet another implementation, a non-transitory computer-readable medium is provided, which comprises instructions to perform a method for matching processing chambers that process semiconductor substrates. The method includes training a neural network by feeding a first set of input time-series data of one or more sensors of a first processing chamber that is within specification to the neural network to produce a corresponding first set of output time-series data. The method further includes calculating a first error between the first set of input time-series data and the corresponding first set of output time-series data. The method further includes feeding a second set of input time-series data from corresponding one or more sensors associated with a second processing chamber under test to the trained neural network to produce a corresponding second set of output time-series data. The method further includes calculating a second error between the second set of input time-series data and the corresponding second set of output time-series data. The method further includes, responsive to the difference between the second error and the first error being equal to or exceeding a threshold amount, declaring that the second processing chamber under test mismatches the first chamber that is within specifications.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
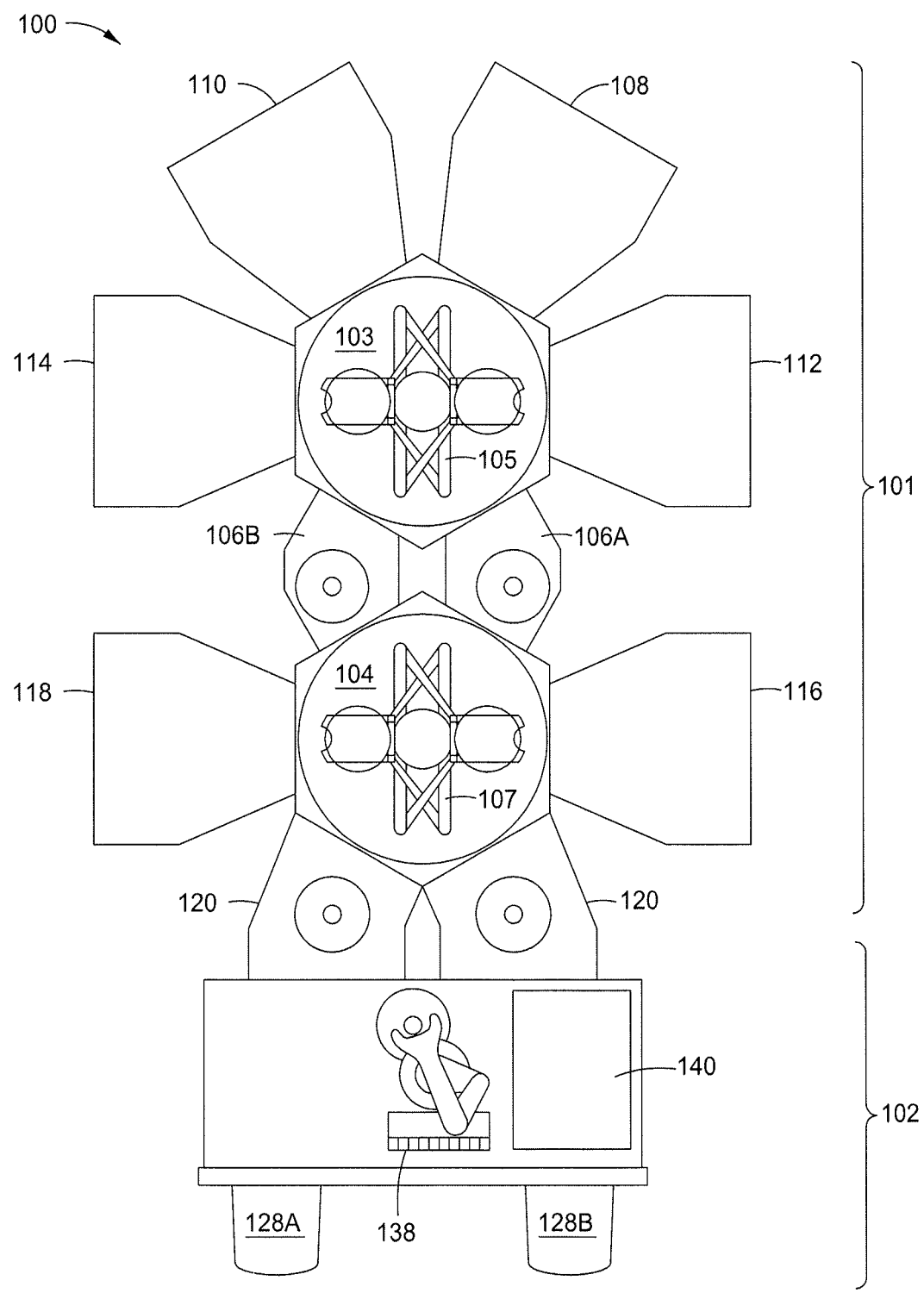
FIG. 1 schematically illustrates a plurality of manufacturing tools for substrate processing, in accordance with one embodiment of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes method for detecting anomalies in time-series data received from a plurality of sensors of the manufacturing tools. Certain details are set forth in the following description and in FIGS. 1-7 to provide a thorough understanding of various implementations of the disclosure. Other details describing well-known structures and systems often associated with plasma etching are not set forth in the following disclosure to avoid unnecessarily obscuring the description of the various implementations.

Many of the details, dimensions, components, and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Achieving proper operation of the production equipment typically involves both an initial set-up and configuration of the equipment prior to processing, and the monitoring and control of the equipment during processing. For process chambers, the initial set-up can include chamber matching, which, as noted above, is a method where the performance of the chamber being commissioned is compared to a data from a set of known good chambers. For monitoring and controlling a process chamber, a method of fault detection is typically used. With chamber fault detection, data are monitored and analyzed to identify behavioral deviations from known good (normal) operation of the chamber.

After the process equipment performance has been confirmed (and corrected) by chamber matching, the chamber can be operated using methods to monitor and control the process. Such methods include fault detection where data are monitored from a process tool and analyzed for behavioral deviations. One of the simplest approaches has been to use statistical process control, or SPC, where certain quantities are monitored against upper and lower control limits. Such control limits can range from simple fixed values to those with complex definitions. If a quantity exceeds a certain limit, then the chamber is 'faulted' and the processing is halted. This approach ensures that substrates are not misprocessed, and as such, reduces scrap loss, and immediately informs the chamber operators of the problem. In the case of recipe execution for substrate processing, the SPC approach is limited since the processing chamber operates in a series of different regions of its operational space while processing a substrate. The dynamics of the recipe execution (and behavior) is difficult to track with simple SPC methodologies.

In a manufacturing environment, a process recipe is typically tuned to match metrology values such as critical dimension (CD) and etch rate (ER). This approach, however, requires at least taking processed substrates from the process line, for testing and metrology, resulting in lost productivity. Furthermore, some metrology techniques are destructive, by nature, resulting in lost revenue due to substrates being destroyed to verify etch rate (ER), and even more importantly, critical dimension (CD). The need exists for a diagnostic that would allow chamber matching and process tuning to be ascertained without the time-consuming routing of processed substrates to metrology stations, or the even more costly destructive metrology techniques. Such novel diagnostics would leverage data collected from existing sensors on the plasma processing chamber, to ensure chamber matching and in-spec critical dimension (CD) and etch rate (ER).

In prior art chamber matching, matching module-level sensor values, such as, for example, matching capacitance positions on the match network, do not guarantee matching of the plasma parameters during device production, and hence produced device characteristics. Sensor-to-sensor variations typically make direct matching of sensor values not useful. Furthermore, the use of statistical fault detection systems requires a user-defined boundary to be defined between normal and abnormal states, for example between normal and abnormal plasma states, as defined by CD metrology data obtained from processed devices. Since there do not exist direct links between, the parameters (controlled and measured), and critical dimension (CD), there is a tendency for such systems to over-diagnose faults. In other words, an increase of the frequency of fault detections may occur when, in-fact, the produced devices are still within-specification. For example, some benign parameter excursion can trigger a false fault detection. Or, in terms of application in chamber matching, post-maintenance seasoning, etc., a slight mismatch of some parameter which is not detrimental to produced device characteristics may cause maintenance personnel to not return the chamber into production for an extended period of time, resulting in unnecessary revenue loss. To address the above shortcomings, embodiments described herein establish a more reliable boundary between normal conditions, and faulty or mismatched chamber state.

Manufacturing integrated circuits on silicon substrates involves a series of different processing operations that may be performed in a single processing system or "tool" which includes a plurality of processing chambers. Further, these multiple silicon substrate processing operations occur over an interval of time. A process may include a transition from a first operation to a second operation. Time-series trace data is data collected over the interval of time, including the transition (e.g., the time-series transition). Time-series trace data of sensors associated with measuring critical dimensions and manufacturing processing, such as etch rate, of chambers under test may serve as a proxy for comparison with corresponding time series data of the "golden" chamber or a chamber known to be in specifications.

Time-series trace data analysis provides the ability to monitor time-series anomalies in process sensor time-series trace data for use in chamber matching. Time-series trace data analysis may detect rare, strange, and/or unexpected sequences (e.g., shape, magnitude, position, etc. of a curve of the time-series trace data (value plotted against sample)) that are undetectable via conventional methods. In one embodiment, a deep auto-encoder type neural network that is trained to minimize reconstruction error of the training time-series trace data. A server is configured to feed a first set of input time-series data of one or more sensors of a first processing chamber known to be within specifications (e.g., a "golden" chamber) to the neural network to produce a corresponding first set of trained output time-series data. The server is further configured to calculate a first error between the first set of input time-series data and the corresponding first set of trained output time-series data. The server is further configured to feed a second set of input time-series data from corresponding one or more sensors associated with a second processing chamber under test to the trained neural network to produce a corresponding second set of output time-series data. The server is further configured to calculate a second error between the second set of input time-series data and the corresponding second set of output time-series data. If the difference between the second error and the first error is equal to or exceeding a threshold amount, the server declared that the second processing chamber under test mismatches the first processing chamber that is within specifications.

FIG. 1 schematically illustrates a manufacturing tool 101 for substrate processing including chamber matching, in accordance with one embodiment of the present disclosure. It is contemplated that the method described herein may be practiced in other tools configured to perform a process sequence. For example, the manufacturing tool 101 embodied in FIG. 1 is the ENDURA® cluster tool commercially available from Applied Materials, Inc. in Santa Clara, Calif.

The manufacturing tool 101 is representative of one or more tools from which data may be obtained. The manufacturing tool 101 includes a vacuum-tight set of processing chambers and a factory interface 102. The plurality of processing chambers 108, 110, 114, 112, 116, 118 perform individual processing steps. The factory interface 102 is coupled to transfer chamber 104 by the load lock chamber 120.

In one embodiment, the factory interface 202 comprises at least one docking station, at least one substrate transfer end effector 138, and at least one substrate aligner 140. The docking station is configured to accept one or more front opening unified pods 128 (FOUP). Two FOUPs 128A, 128B are shown in the embodiment of FIG. 1. The substrate transfer end effector 138 is configured to transfer the substrate from the factory interface 102 to the load lock chamber 120.

The load lock chamber 120 has a first port coupled to the factory interface 102 and a second port coupled to a first transfer chamber 104. The load lock chamber 120 is coupled to a pressure control system which pumps down and vents the chamber 120 as needed to facilitate passing the substrate between the vacuum environment of the transfer chamber 104 and the substantially ambient (e.g., atmospheric) environment of the factory interface 102.

The first transfer chamber 104 and the second transfer chamber 103 respectively have a first end effector 107 and a second end effector 105 disposed therein. Two substrate transfer platforms 106A, 106B are disposed in the transfer chamber 104 to facilitate transfer of the substrate between end effectors 105, 107. The platforms 106A, 106B can either be open to the transfer chambers 103, 104 or be selectively isolated (i.e., sealed) from the transfer chambers 103, 104 to allow different operational pressures to be maintained in each of the transfer chambers 103, 104.

The end effector 107 disposed in the first transfer chamber 104 is capable of transferring substrates between the load lock chamber 120, the processing chambers 116, 118, and the substrate transfer platforms 106A, 106B. The end effector 105 disposed in the second transfer chamber 103 is capable of transferring substrates between the substrate transfer platforms 106A, 106B and the processing chambers 112, 114, 110, 108.

In one embodiment, one or more of the processing chambers 108, 110, 114, 112, 118, 116 may be designated as one or more "golden chamber," (e.g., 110) while the remaining chambers 108, 114, 112, 118, 116 are processing chambers under test for matching to the golden chamber. In another embodiment, all of the processing chambers 108, 110, 114, 112, 118, 116 may be designated as processing chambers under test. One or more separate golden chambers (not shown) may be provided to test one or more of the processing chambers 108, 110, 114, 112, 118, 116. In yet another embodiment trace data taken from one or more golden chambers of one or more types may be stored in a database for comparison by a server (not shown) to trace data taken from the processing chambers 108, 110, 114, 112, 118, 116 and processed for chamber matching by the server using a neural network to be discussed herein below.

In some embodiments, the manufacturing tool 101 is associated with a manufacturing execution system (MES). The data may include, for example, time-series traces of various sensors. The data may be aggregated and analyzed at a central location, such as the server, and used to detect matches or mismatches of chambers based on time-series trace data in real-time.

The trace data may be provided from the server to the MES that can be analyzed and so that corrective action may be taken as needed regarding problems which are identified as a result of detected anomalies in time series trace data that result in declarations of mismatches between chambers. The server may also determine appropriate corrective action to be taken based on analysis of the data (e.g., based on identifying correlations between time-series trace data of sensors and metrology data taken from other sensors that measure parameters of a substrate), and provide instructions to perform corrective action. In some embodiments, the MES may automatically take corrective action (e.g., recalibrating or adjusting a parameter of a lithography tool, redoing a portion of the manufacturing process for a substrate, or other suitable computing device) based on the predictive information. In certain embodiments, if the predictive information identifies a problem with one or more parameters of a substrate, the problem may be verified by analyzing the substrate (e.g., using metrology tools). If the problem is confirmed by analyzing the substrate, corrective action may then be taken (e.g., manually or automatically by the MES).

Figure 2:
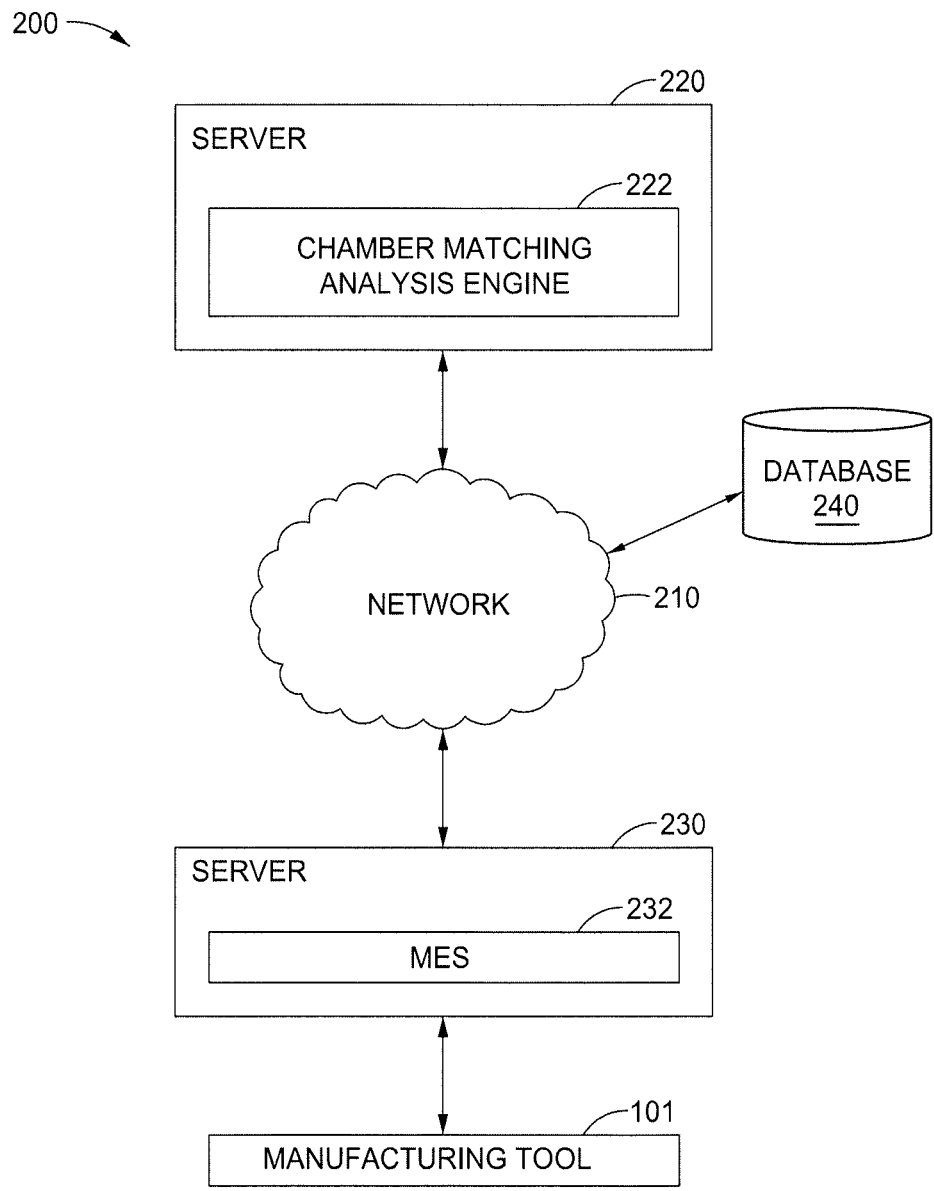
FIG. 2 depicts a network environment in which embodiments of the present disclosure may be implemented.

FIG. 2 depicts a network environment 200 in which embodiments of the present disclosure may be implemented. As shown, network environment 200 includes a server 220 which is connected via network 210 to another server 230 which is connected to one or more manufacturing tools 101. Network 210 may, for example, comprise the Internet. In another embodiment, manufacturing tool 101 is also connected directly to server 220.

Server 220 may comprise a computing device such as a rack server, desktop or laptop computer, mobile phone, tablet, or other suitable computing device. As shown, server 220 comprises a chamber matching analysis engine 222, which may perform operations described herein related to making determinations and predictions regarding matching chambers. The chamber matching analysis engine 222 identifies data sources 206A-N (e.g., sensors) that define a system and/or that are used to monitor a system, such as the manufacturing tool 101.

For example, chamber matching analysis engine 222 may analyze time-series sensor data received from MES 232 or directly from the manufacturing tool 101 in order to detect, analyze, and verify chamber matches or mismatches.

For example, the chamber matching analysis engine 222 may analyze process and substrate sensor information received from MES 232 or directly from sensors applied within the manufacturing tool 101 in order to detect mismatches in sensor trace data of one or more of the processing chambers with corresponding sensor trace data of corresponding golden chambers stored within a database 240. In some embodiments, the server 220 and the database 240 are separate from the manufacturing tool 101. In other embodiments, the server 220 and the database 240 may be part of the manufacturing tool 101 or may be an off-line server.

For example the chamber matching analysis engine 222 may receive time-series sensor trace data from MES 232 representing temperature, gas flow, or RF power current, etc. collected from a plurality of sensors associated with the manufacturing tool 101 configured to process a silicon substrate. The chamber matching analysis engine 222 may employ a deep auto-encoder type neural network that is trained to minimize reconstruction error of input training time-series data.

The chamber matching analysis engine 222 may feed a first set of input time-series data of one or more sensors of a first processing chamber known to be within specifications (e.g., a golden chamber) to the neural network taken directly from the golden chamber of the manufacturing tool 101 or from the database 240 that stores traces of the golden chamber to produce a corresponding first set of trained output time-series data. The chamber matching analysis engine 222 is further configured to calculate a first error between the first set of input time-series data and the corresponding first set of trained output time-series data. The chamber matching analysis engine 222 is further configured to feed a second set of input time-series data from corresponding one or more sensors associated with a second processing chamber under test to the trained neural network to produce a corresponding second set of output time-series data. The chamber matching analysis engine 222 is further configured to calculate a second error between the second set of input time-series data and the corresponding second set of output time-series data. If the difference between the second error and the first error is equal to or exceeding the threshold amount, the chamber matching analysis engine 222 declares that the second processing chamber under test mismatches the first processing chamber that is within specifications. If the difference between the second error and the first error below the threshold amount, the chamber matching analysis engine 222 declares that the second processing chamber under test matches the first processing chamber that is within specifications.

In one example, calculated errors are calculated mean square errors of the total distribution of trace data of a chamber. The threshold amount may be set to the mean plus three sigma of the training reconstruction mean squared error as the cutoff. The chamber matching analysis engine 222 may instruct the manufacturing system (MES) 232 to take corrective action to remove a source of an anomaly in one or more time series trace data of the chambers under test that caused the mismatch.

The chamber matching analysis engine 222 may provide predictive information to MES 232 about future anomalies in the sensor data. In some embodiments, the chamber matching analysis engine 222 may also determine corrective action to be taken with respect to processes or individual substrates based on the data. For example, the chamber matching analysis engine 222 may identify a correlation between a measured anomaly associated with a temperature sensor correlated with a certain substrate parameter problem and a tool parameter, and determine that the tool parameter should be adjusted by a certain amount. Furthermore, the chamber matching analysis engine 222 may determine actions to be performed on a substrate to bring one or more predicted parameters into an acceptable range (e.g., correcting overlay marks, stripping and recoating the substrate, and the like).

Predictive information regarding substrate quality with respect to parameters may permit personnel or the MES 232 to improve the manufacturing process (e.g., lithography, etching, deposition, and planarization may be improved to achieve predictable properties).

Server 230 may comprise a computing device such as a rack server, desktop or laptop computer, mobile phone, tablet, or other suitable computing device. As shown, server 220 comprises an MES 232, which may perform operations described herein related to managing the manufacturing of silicon substrates. For example, MES 232 may coordinate processes performed by the manufacturing tool 101, and may collect data from the manufacturing tool 101 (e.g., tool parameters, thickness, optical reflective index, absorption index, strength, overlay and alignment data, critical dimension variation across the substrate, and the like) and time traces from sensors used by the manufacturing tool 101. In some embodiments, the data may be time-series traces which represent the behavior of sensors over time as manufacturing processes are performed. MES 232 may provide this information to the chamber matching analysis engine 222 (e.g., over network 210), which may analyze the information and provide verification of the detection of mismatches. In some embodiments, the chamber matching analysis engine 222 may provide instructions to MES 232 regarding corrective action to take with respect to an individual defect, the manufacturing tool 101, or other aspects of the manufacturing process. In certain embodiments, MES 232 automatically takes corrective action, such as by instructing individual sensors of individual chambers within the manufacturing tool 101 to perform certain tasks (e.g., instructing a lithography tool to strip and recoat a substrate in order to correct an alignment defect or instructing a deposition tool to alter one or more parameters).

The manufacturing tool 101 may include one or more chambers which perform processes related to manufacturing silicon substrates. For example, the manufacturing tool 101 may include lithography chambers, etching chambers, deposition chambers, and planarization chambers. The manufacturing tool 101 may communicate with MES 232 in order to receive instructions and provide data from sensors within a particular chamber (e.g., time-series data representing the values output by one or more sensors associate with of parameters of substrates captured by sensors over time during manufacturing).

Embodiments of the present disclosure employ an artificial neural network architecture known as a deep auto-encoder. Artificial neural networks are machine learning models inspired by the operating principles of the neural network of the human brain and have been widely applied to problems of classification and function approximation. Deep learning is part of a broader family of machine learning methods based on learning data representations, as opposed to task-specific algorithms. Deep learning is a class of machine learning algorithms that use a cascade of multiple layers of nonlinear processing units for feature extraction and transformation of input data. Each successive layer of the multiple layers uses the output from the previous layer as input. The multiple layers are then trained to learn a representation (encoding) of a set of input data, typically for the purpose of dimensionality reduction in an unsupervised (e.g., pattern analysis) manner.

A deep auto-encoder is a type of deep learning feed-forward neural network with one or more layers of hidden nodes, of which there are usually fewer nodes in successive layers than the input nodes in the encoding half and the decoding half usually has a structure that is mirror symmetric to the encoding half. The structure of the deep auto-encoder aids the embedded the neural network to learn the best representation of the input data corresponding to a set of training data derived from non-anomalous input sensor traces of the golden or in-specification chamber and to reconstruct the input data as output data corresponding to the input sensor traces. In one embodiment, the deep auto-encoder is trained with non-anomalous sensor trace data runs to learn a minimum set of features necessary to reproduce the input sensor trace data at an output of the deep auto-encoder minimizing reconstruction error. More specifically, the learning is the process of determining the connection weights between the layers such that performance is maximized when solving a learning problem. The representation is the normal signature of each of the sensor traces. Accordingly, the auto-encoder generates an output that is identical to the input.

Figure 3:
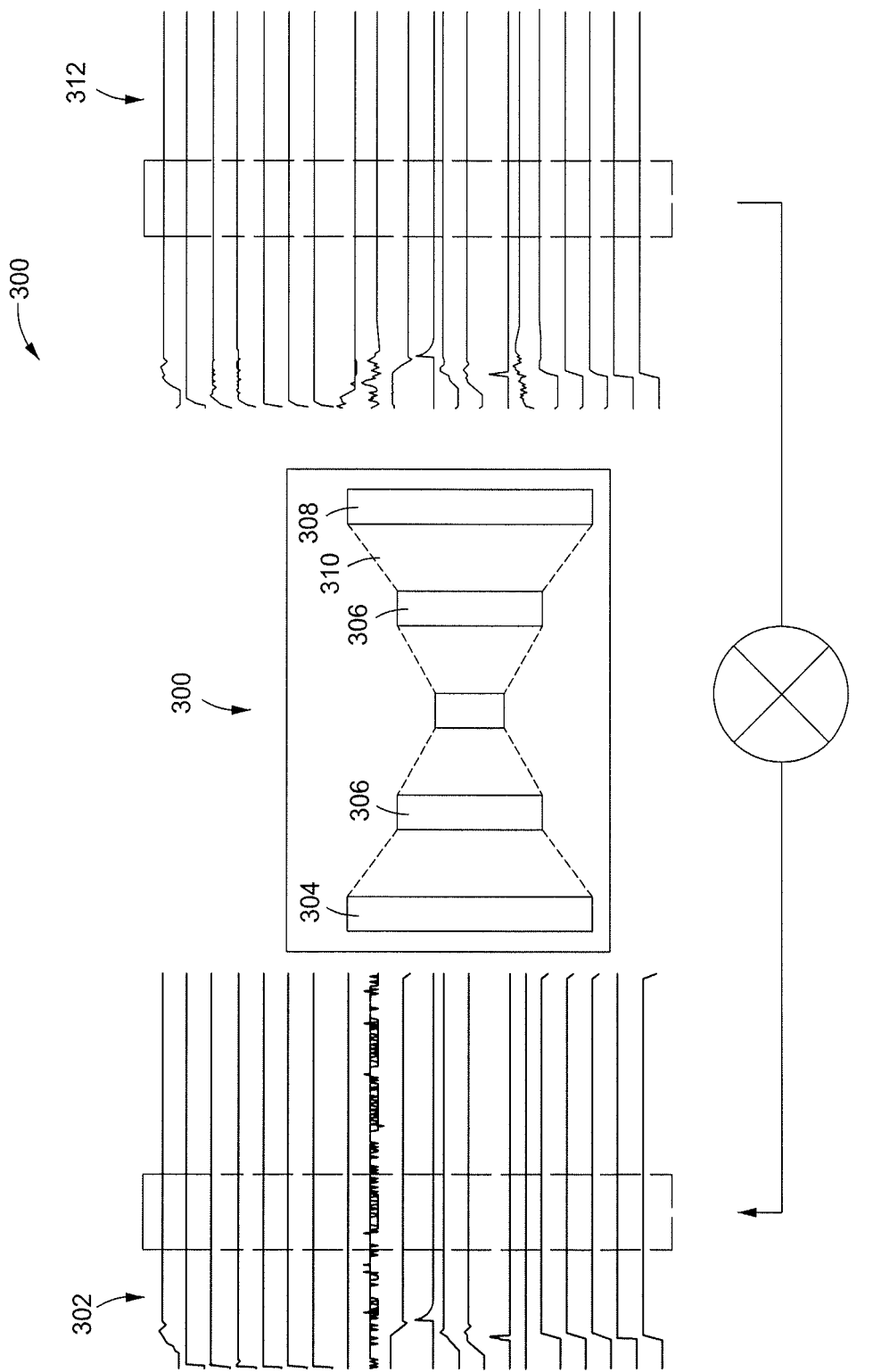
FIG. 3 illustrates a deep auto-encoder to be employed in embodiments of the present disclosure.

FIG. 3 illustrates a deep auto-encoder 300 to be employed in embodiments of the present disclosure. The input data 302 to the deep auto-encoder 300 comprises time slices of the sensor traces derived from a matrix representation of a plurality of time-series trace data of a plurality of sensors associated with the manufacturing tool 101 or from one or more golden chambers stored in the database 240. The deep auto-encoder 300 may comprise an input layer 304, one or more hidden layers 306, a central bottleneck layer 308, an output layer 310, and a full set of connections 312 between the layers. The structure of the hidden layers 306 is symmetric with respect to the bottleneck layer 308, which has the smallest number of nodes. The bottleneck layer 308 is employed to help the neural network 300 find the minimal representation of the input data 302 reconstructed to the output data 314 by extracting a limited number of features that represent the input data 302. A designer only needs to define the number of layers in the deep auto-encoder 300, and how many nodes there are to be in each of the layers. The deep auto-encoder 300 is trained with example trace data having no anomalies from the golden chamber and is configured to produce output data 314 that is a reconstruction of the plurality of trace s corresponding to the input data 302, wherein the output data 314 has minimized reconstruction error (e.g., the mean squared error, or MSE) relative to the input traces. In an example, minimizing reconstruction error minimizes mean square error between training time-series trace data fed to the neural network 300 and output trace data of the neural network 300. The reconstruction error is minimized for a minimum set of the global and time invariant features learns by the deep auto-encoder 300 during training necessary to reproduce the input sensor traces.

Minimizing reconstruction error forces the deep auto-encoder 300 to engage in dimensionality reduction, for example, by learning how to identify the global and time invariant features of the input data 302 corresponding to the input traces. The deep auto-encoder 300 learns to compress data from the input layer 304 into a short code, and then un-compress that code into something that closely matches the original input data 302.

The deep auto-encoder 300 is trained before use on real data. The training algorithm for a deep auto-encoder can be summarized as follows: for each input, perform a feed-forward pass to compute activations at all hidden layers, then at the output layer to obtain an output; measure a deviation of from the input that minimizes reconstruction error, e.g. mean squared error). Then back propagate the error through the nodes of the deep auto-encoder 300 and perform weight updates. Accordingly, the hidden nodes of the hidden layers 306 are trained to reconstruct the input at the output by minimizing reconstruction error. As a result, the hidden nodes learn the global and time invariant features of the input traces necessary to reproduce the input traces. Minimizing the reconstruction error (e.g., the mean squared error, or MSE) yields a deep auto-encoder 300 that outputs the corresponding sensor signals.

Figure 4:
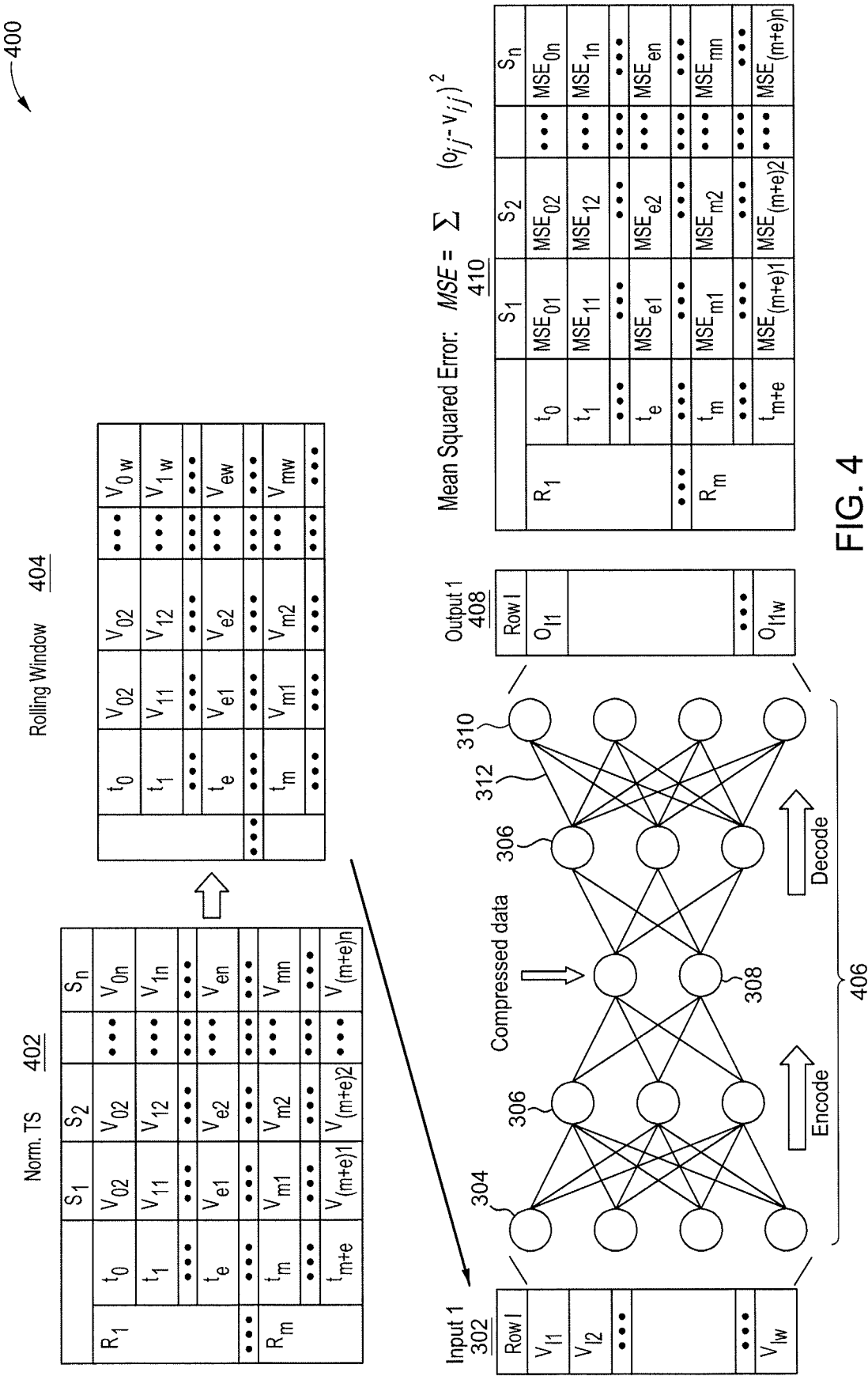
FIG. 4 shows the architecture of the deep auto-encoder in a modular fashion.

FIG. 4 shows the architecture 400 of the deep auto-encoder 300 in a modular fashion. The multiple sensor time-series trace data needed to train the deep auto-encoder 300 or to test actual trace runs are preprocessed by the chamber matching analysis engine 222 before being fed into the deep auto-encoder 300 contained within the chamber matching analysis engine 222. Preprocessing includes normalizing each of the time-series trace data to the range of [0,1] (min-max normalization, (x-min)/(max-min)). In deployment of the method, the min max value came from the training runs only. Preprocessing further includes extracting a plurality of rolling time windows 404 (sub-matrices) of each of the input time series trace data at a plurality of timestamps from a matrix 402 comprising value/timestamp pairs of the input time-series trace data from all of the sensors for all timestamps and feeding the plurality of rolling time windows 404 of value/timestamp data $V_{ij}$ as input data to the deep auto-encoder 300.

The dimensions of matrix 402 depends on the length(w) and step size of the rolling time windows 404 The length and step size are the hyperparameter of the deep learning model.

From the plurality of rolling time windows 404, a row of values $V_{li}$-$V_{w1}$ to $V_{ln}$-$V_{wn}$ is fed by the chamber matching analysis engine 222 into the deep auto-encoder 300. The minimal global and time invariant features set of the input trace data 302 is learned by the deep auto-encoder 300 by back-propagation and stochastic gradient descent based on the training (no fault) data. The nodes of the deep auto-encoder 304, 306, 308 encode the rolling window data 404, compress the rolling window data 404, and decode/decompress the rolling window data at layers 308-312 to produce an output row of reconstructed input traces values as output trace values 408 for each time stamp ($O_{li}$-$O_{(w1}$ to $O_{ln}$-$O_{wn}$)). While testing, the whole chain of the nodes 406 in the layers 304-310 is operated in a feed-forward fashion in real-time and provides the RMS reconstruction error for a time window.

In one embodiment, the deep auto-encoder 300 is trained with the normal runs of the golden chamber using an optimizer. One such optimizer is an adaptive moment estimation (Adam) optimizer. An Adam optimizer is algorithm for first-order gradient-based optimization of stochastic objective functions, based on adaptive estimates of lower-order moments. The average reconstruction error (e.g., mean square error) of the time window over all sensors denotes how far the time window is from the nominal condition and is used as an anomaly indicator.

In other embodiments, other network structure hyperparameters may be employed based on: the number of layers, how many nodes are in each layer, the rolling window size, the activation function of the neural network, etc.

Once the minimal feature set is learned, an actual set of runs of time-series trace data is fed to the deep auto-encoder 300 which then produces output data 314 corresponding to minimum reconstruction error version of the input data 302 using the same rolling window technique and deep auto-encoder 300 compression/decompression techniques. The chamber matching analysis engine 222 then calculates a mean squared error between the output data 408 ($O_{li}$-$O_{w1}$ to $O_{ln}$-$O_{wn}$) representing the reconstructed input data corresponding to the input time-series traces and the input data 302 ($V_{li}$-$V_{w1}$ to $V_{ln}$-$V_{wn}$) corresponding to the original time-series traces for each of the sensors of the plurality of sensors for the manufacturing tool 101 or the golden chamber. The chamber matching analysis engine 222 then computes a mean square error between output data ($O_{li}$-$O_{w1}$ to $O_{ln}$-$O_{wn}$) representing the reconstructed input data corresponding to the input time-series traces and the input data 302 ($V_{li}$-$V_{w1}$ to $V_{ln}$-$V_{wn}$) of a manufacturing tool 101 under test with a corresponding a mean square error between output data ($O_{li}$-$O_{w1}$ to $O_{ln}$-$O_{wn}$) representing the reconstructed input data corresponding to the input time-series traces and the input data 302 ($V_{li}$-$V_{w1}$ to $V_{ln}$-$V_{wn}$) of the golden chamber taken from the database 240. If the mean square error of a chamber of manufacturing tool 101 exceeds the mean square error of the golden chamber by a predetermined threshold, then the chamber matching analysis engine 222 declares a mismatch between the golden chamber and the selected one of the chambers.

The individual mean square error timestamp values $MSE_{ij}$ (410) contribute to the overall mean square error calculation. Suppose the input time series data is $v_1, v_2, \ldots, v_t$, then after the data is fit in the trained neural network model, the reconstructed output has the same dimension time series $o_1, o_2, \ldots, o_t$. The square reconstructed error $MSE=\Sigma(o_{ij}-v_{ij})^2$ is then calculated. Each timestamp has a squared error value. A mean of the squared error within the window is taken as the anomaly score.

The mean of the squared error for each timestamp per run (or per step) can then be aggregated. If this mean squared error per run (or per step) is above certain threshold, then the run (or step) is declared to be an anomaly in a given sensor.

Figure 5:
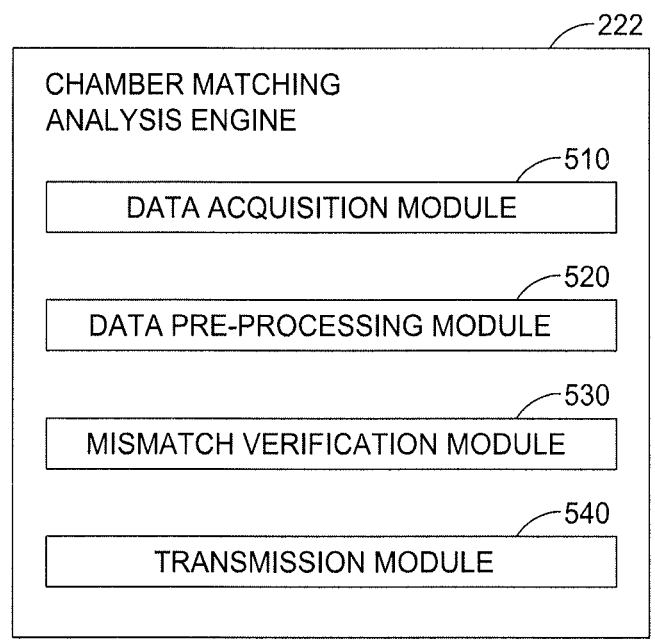
FIG. 5 illustrates components of a chamber matching analysis engine according to embodiments of the present disclosure.

FIG. 5 illustrates components of chamber matching analysis engine 222 according to embodiments of the present disclosure. As shown, the chamber matching analysis engine 222 includes a data acquisition module 510, which may acquire data from MES 232 (e.g., over network 210) or the database 240. In alternative embodiments, data acquisition module 510 acquires time-series trace data directly from sensors within the chamber of the manufacturing tool 101 or indirectly from the database 240 representing the golden chamber. The chamber matching analysis engine 222 further includes a data pre-processing module 520, which may preprocess the time-series traces, time slices the traces, and feeds the time slices to the deep auto-encoder 300 according to the method described in FIG. 6. The chamber matching analysis engine 222 further includes a mismatch verification module 530, which employs the deep auto-encoder 300 to determine whether there is a mismatch between a chamber under test of the manufacturing tool 101 and the golden chamber data stored in the database 240. A mismatch between the chamber under test and the golden chamber is declared based on whether a difference in mean square error between output reconstructed time-series traces and a corresponding input time-series traces of the chamber under test exceeds a difference in mean square error between an output reconstructed time-series traces and a corresponding input time-series traces of the golden chamber by a predetermined threshold amount. The chamber matching analysis engine 222 further includes a transmission module 540, which may transmit data such as sensor information and corrective instructions to MES 232 (e.g., over network 210) or to other destinations.

In another embodiment, the chamber matching analysis engine 222 can detect mismatches between process chambers of the semiconductor manufacturing tool 101 for one golden chamber and a plurality of processing chambers under test of the same type as the golden chamber as described below in connection with FIG. 7. In yet another embodiment, the chamber matching analysis engine 222 can detect mismatches between process chambers of semiconductor manufacturing tools 101 for a plurality of golden chambers of a plurality of types and a plurality of processing chambers under test of the plurality of types as the golden chamber as described below in connection with FIG. 8.

Figure 6:
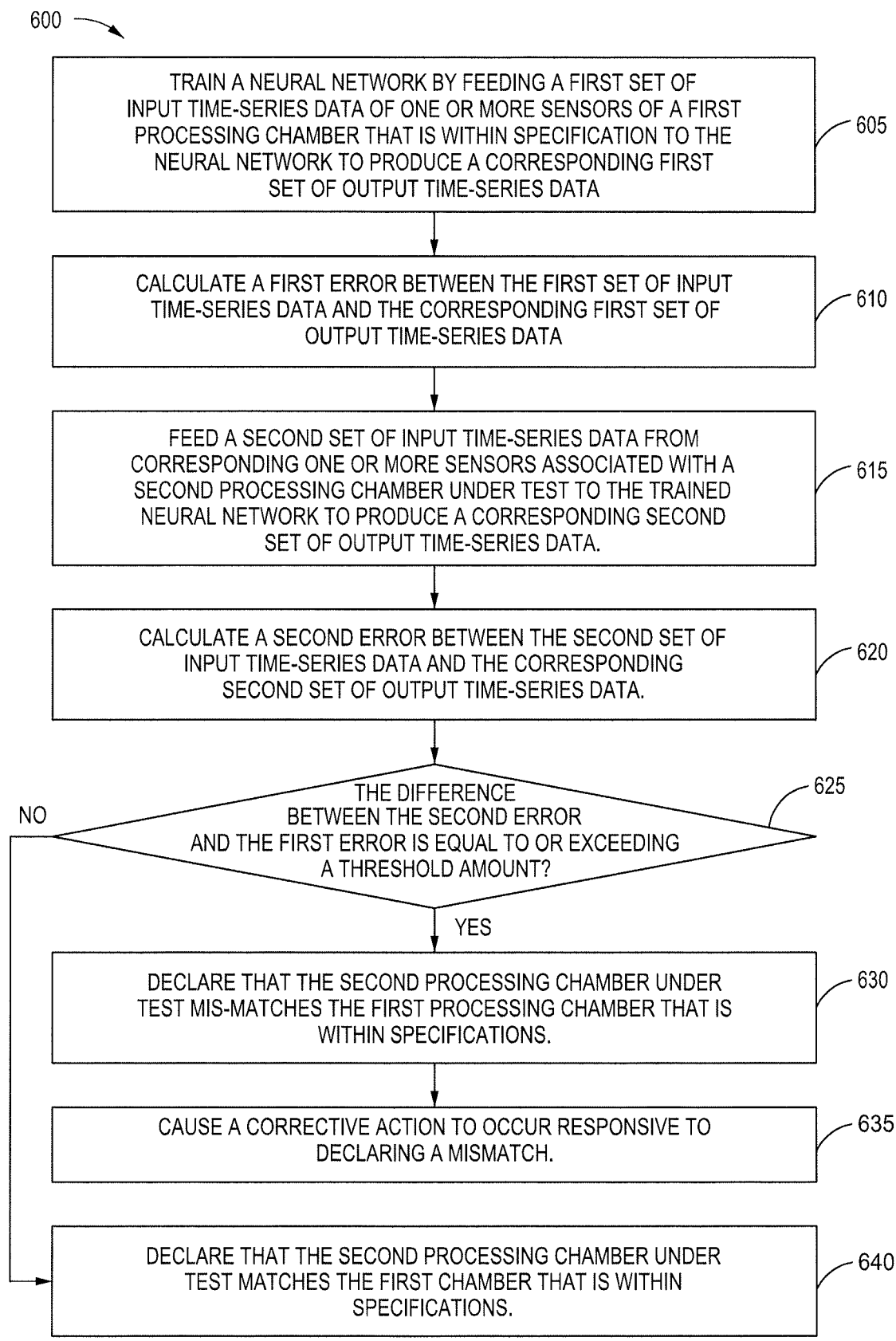
FIG. 6 illustrates one embodiment of a method for detecting mismatches between process chambers of semiconductor manufacturing tools for one golden chamber and one processing chambers under test of the same type as the golden chamber.

FIG. 6 illustrates one embodiment of a method 600 for detecting mismatches between process chambers of the semiconductor manufacturing tool 101 for one golden chamber and one processing chambers under test of the same type as the golden chamber. Method 600 can be performed by processing logic that can comprise hardware (e.g., circuitry, dedicated logic, programmable logic, microcode, etc.), software (e.g., instructions run on a processing device), or a combination thereof. In one embodiment, method 600 is performed by the chamber matching analysis engine 222 of FIG. 2.

At block 605, the chamber matching analysis engine 222 trains a neural network 300 by feeding a first set of input time-series data of one or more sensors of a first processing chamber that is within specification (e.g., a golden chamber) to the neural network 300 to produce a corresponding first set of output time-series data. At block 610, the chamber matching analysis engine 222 calculates a first error between the first set of input time-series data and the corresponding first set of output time-series data. In an example, the first error is a mean square error.

At block 615, chamber matching analysis engine 222 feeds a second set of input time-series data from corresponding one or more sensors associated with a second processing chamber (e.g., of the manufacturing tool 101) under test to the trained neural network 300 to produce a corresponding second set of output time-series data.

Each of the input time-series trace data are min-max normalized. Preprocessing further includes extracting an input time slice of each of the input time series traces at a moment in time from a matrix comprising time slices of the input time-series traces from all of the sensors for all moments in time of and feeding the time slice as input data to the deep auto-encoder 300. The chamber matching analysis engine 222 further extracts an input vector from the matrix comprising a time slice of the input time-series traces from all of the sensors and feeds the time slice as input data to the neural network 300.

At block 620, the chamber matching analysis engine 222 calculates a second error between the second set of input time-series data and the corresponding second set of output time-series data. In one embodiment, the error is a mean square error. If, at block 625, the difference between the second error and the first error is equal to or exceeds a threshold amount, then at block 630, the chamber matching analysis engine 222 declares that the second processing chamber under test mismatches the first processing chamber that is within specifications. At block 635, the chamber matching analysis engine 222 causes a corrective action to occur responsive to declaring a mismatch. The corrective action can include, for example, displaying an alert, generating an audible alert, stopping a tool from performing further processing, or instructing a manufacturing system to take corrective action to remove a cause of the declared mismatch.

If, at block 625, the difference between the second error and the first error is below the threshold amount, then at block 640, the chamber matching analysis engine 222 declares that the second processing chamber under test matches the first processing chamber that is within specifications. In one example, the threshold amount may be set to the mean plus three sigma of the training reconstruction mean squared error as the cutoff.

Figure 7:
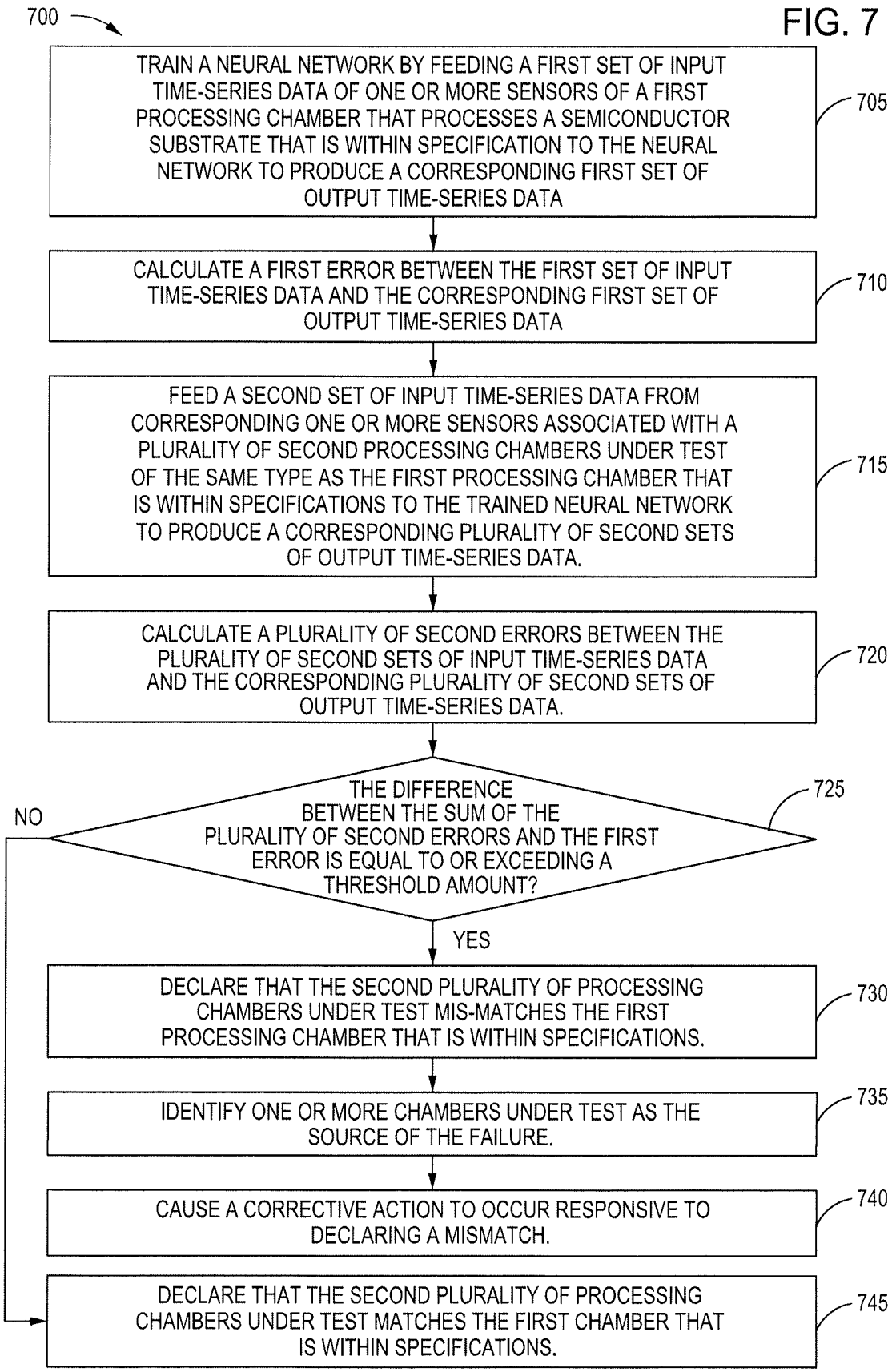
FIG. 7 illustrates one embodiment of a method for detecting mismatches between process chambers of semiconductor manufacturing tools for one golden chamber and a plurality of processing chambers under test of the same type as the golden chamber.

FIG. 7 illustrates one embodiment of a method 700 for detecting mismatches between process chambers of the semiconductor manufacturing tool 101 for one golden chamber and a plurality of processing chambers under test of the same type as the golden chamber. Method 700 can be performed by processing logic that can comprise hardware (e.g., circuitry, dedicated logic, programmable logic, microcode, etc.), software (e.g., instructions run on a processing device), or a combination thereof. In one embodiment, method 700 is performed by the chamber matching analysis engine 222 of FIG. 2.

At block 705, the chamber matching analysis engine 222 trains a neural network 300 by feeding a first set of input time-series data of one or more sensors of a first processing chamber that processes a semiconductor substrate that is within specification (e.g., a golden chamber) to the neural network 300 to produce a corresponding first set of output time-series data. At block 710, the chamber matching analysis engine 222 calculates a first error between the first set of input time-series data and the corresponding first set of output time-series data. In an example, the first error is a mean square error.

At block 715, chamber matching analysis engine 222 feeds a second set of input time-series data from corresponding one or more sensors associated with a plurality of second processing chambers (e.g., of the manufacturing tool 101) under test of the same type as the first processing chamber that is within specifications to the trained neural network to produce a corresponding plurality of second sets of output time-series data.

At block 720, the chamber matching analysis engine 222 calculates a plurality of second errors between the plurality of second sets of input time-series data and the corresponding plurality of second sets of output time-series data. In one embodiment, the errors are mean square errors. If, at block 725, the difference between the sum of the plurality of second errors and the first error is equal to or exceeding a threshold amount, then at block 730, the chamber matching analysis engine 222 declares that the second plurality of processing chambers under test mismatches the first processing chamber that is within specifications. At block 735, the chamber matching analysis engine 222 identifies one or more chambers under test as the source of the failure. At block 740, the chamber matching analysis engine 222 causes a corrective action to occur responsive to declaring a mismatch. The corrective action can include, for example, displaying an alert, generating an audible alert, stopping a tool from performing further processing, or instructing a manufacturing system to take corrective action to remove a cause of the declared mismatches.

If, at block 725, the difference between the weighted sum of the plurality of second errors and the first error is below the threshold amount, then at block 745, the chamber matching analysis engine 222 declares that each of the plurality of second processing chambers under test matches the first processing chamber that is within specifications. In one example, the threshold amount may be set to the mean plus three sigma of the training reconstruction mean squared error as the cutoff.

Figure 8:
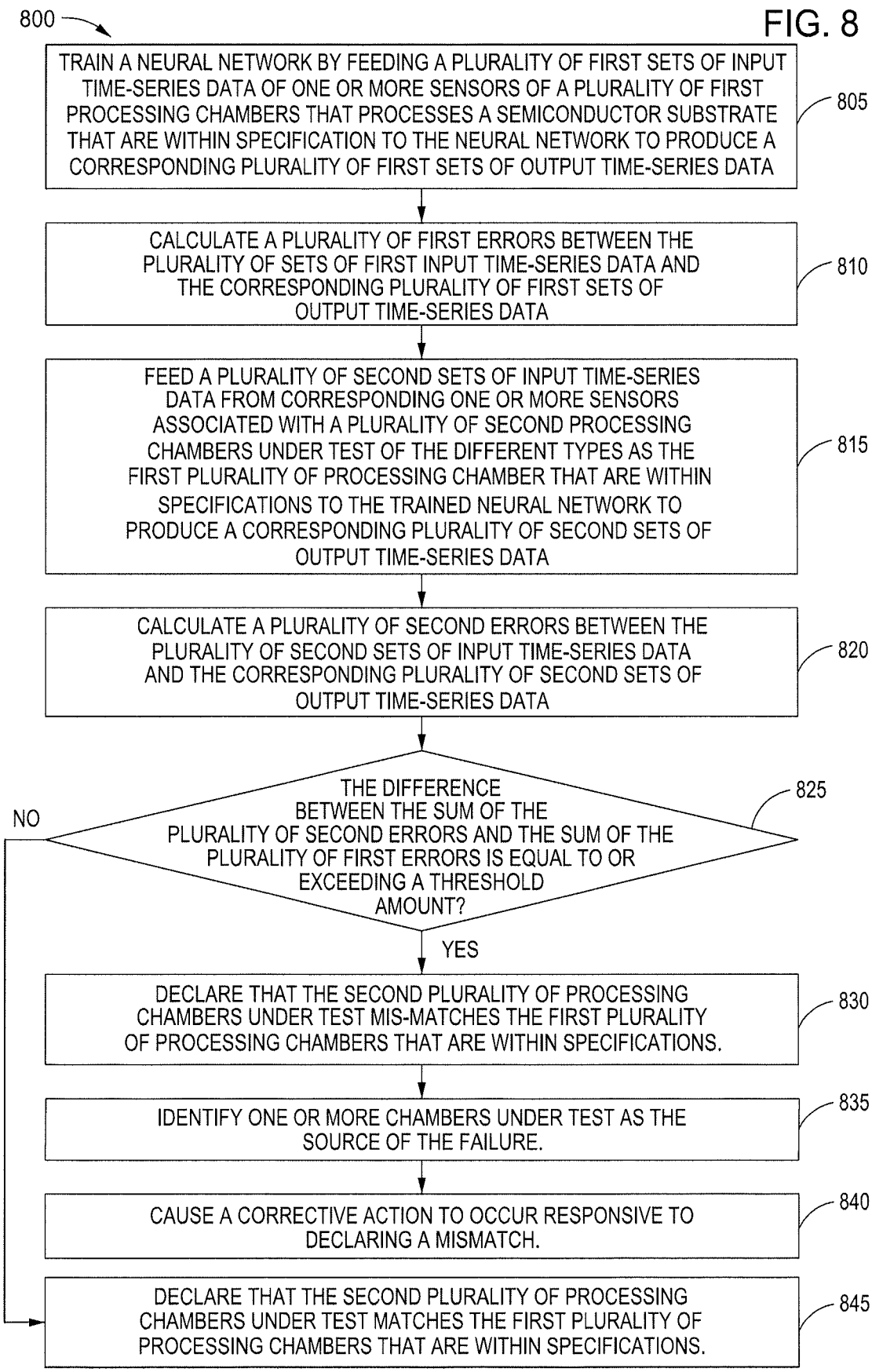
FIG. 8 illustrates one embodiment of a method for detecting mismatches between process chambers of semiconductor manufacturing tools for a plurality of golden chambers of different types and a plurality of processing chambers under test of the corresponding different types as the golden chamber.

FIG. 8 illustrates one embodiment of a method 800 for detecting mismatches between process chambers of the semiconductor manufacturing tool 101 for a plurality of golden chambers of different types and a plurality of processing chambers under test of the corresponding different types as the golden chamber. Method 800 can be performed by processing logic that can comprise hardware (e.g., circuitry, dedicated logic, programmable logic, microcode, etc.), software (e.g., instructions run on a processing device), or a combination thereof. In one embodiment, method 800 is performed by the chamber matching analysis engine 222 of FIG. 2.

At block 805, the chamber matching analysis engine 222 trains a neural network 300 by feeding a plurality of first sets of input time-series data of one or more sensors of a plurality of first processing chambers that processes a semiconductor substrate that are within specification (e.g., a plurality of golden chambers) to the neural network 300 to produce a corresponding plurality of first sets of output time-series data. At block 810, the chamber matching analysis engine 222 calculates a plurality of first errors between the plurality of sets of first input time-series data and the corresponding plurality of first sets of output time-series data. In an example, the first errors are mean square errors.

At block 815, chamber matching analysis engine 222 feeds a plurality of second sets of input time-series data from corresponding one or more sensors associated with a plurality of second processing chambers (e.g., of the manufacturing tool 101) under test of the different types as the first plurality of processing chamber that are within specifications to the trained neural network to produce a corresponding plurality of second sets of output time-series data.

At block 820, the chamber matching analysis engine 222 calculates a plurality of second errors between the plurality of second sets of input time-series data and the corresponding plurality of second sets of output time-series data. In one embodiment, the errors are mean square errors. If, at block 825, the difference between the sum of the plurality of second errors and the sum of the plurality of first errors is equal to or exceeding a threshold amount, then at block 830, the chamber matching analysis engine 222 declares that the second plurality of processing chambers under test mismatches the first plurality of processing chambers that are within specifications. At block 835, the chamber matching analysis engine 222 identifies one or more chambers under test as the source of the failure. At block 840, the chamber matching analysis engine 222 causes a corrective action to occur responsive to declaring a mismatch. The corrective action can include, for example, displaying an alert, generating an audible alert, stopping a tool from performing further processing, or instructing a manufacturing system to take corrective action to remove a cause of the declared mismatches.

If, at block 825, the difference between the sum of the plurality of second errors and the sum of the plurality of first errors is below the threshold amount, then at block 845, the chamber matching analysis engine 222 declares that each of the plurality of second processing chambers under test matches each of the plurality of first processing chambers that are within specifications. In one example, the threshold amount may be set to the mean plus three sigma of the training reconstruction mean squared error as the cutoff.

Figure 9:
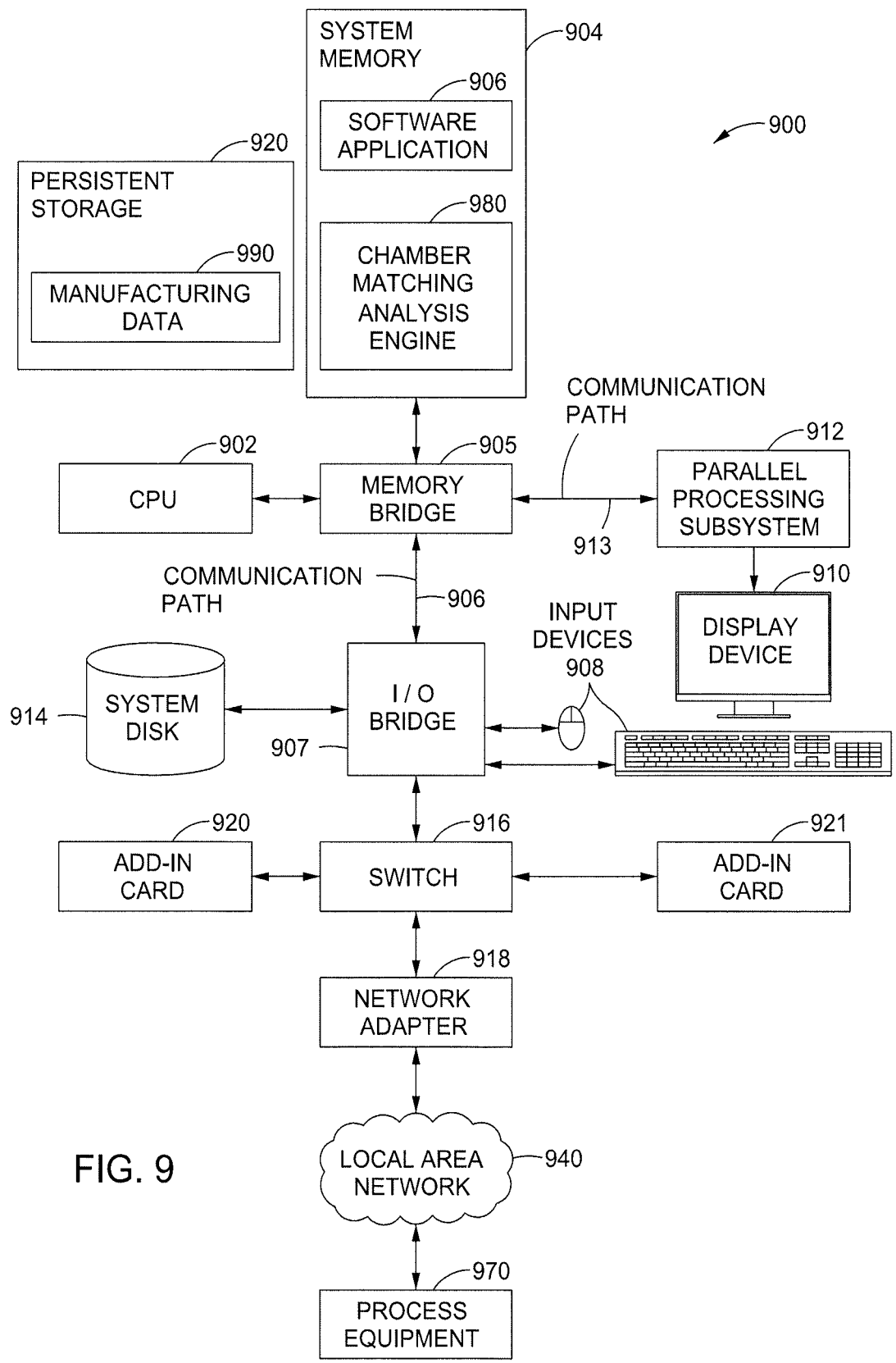
FIG. 9 depicts an example computer system with which embodiments of the present disclosure may be implemented.

FIG. 9 illustrates an example computing system 900 used to detect and analyze anomalies, according to some embodiments of the present disclosure. In certain embodiments, computer system 900 is representative of the server 220. Aspects of computer system 900 may also be representative of other devices used to perform techniques described herein (e.g., server 230). For example, computing system 900 may be a personal computer, industrial processor, personal digital assistant, mobile phone, mobile device or any other device suitable for practicing one or more embodiments of the present invention.

The system 900 includes a central processing unit (CPU) 902 and a system memory 904 communicating via a bus path that may include a memory bridge 905. CPU 902 includes one or more processing cores, and, in operation, CPU 902 is the master processor of the system 900, controlling and coordinating operations of other system components. System memory 904 stores a software application 906, and data, for use by CPU 902. CPU 902 runs software applications and optionally an operating system.

Illustratively, the system memory 904 includes the chamber matching analysis engine 980, which may correspond to the chamber matching analysis engine 222, which performs operations related to detecting chamber mismatches, according to techniques described herein. For example, the chamber matching analysis engine 980 may be equivalent to the chamber matching analysis engine 222 in FIG. 2, and may employ a deep auto-encoder type neural network 300 that reconstructs one or more input time-series traces as corresponding one or more output time-series traces based on a model which minimizes reconstruction error of training time-series traces, and, based on that set, identifies matches or mismatches of processing chambers and other aspects of the manufacturing process.

Memory bridge 905, which may be, e.g., a Northbridge chip, is connected via a bus or other communication path (e.g., a HyperTransport link) to an I/O (input/output) bridge 907. I/O bridge 907, which may be, e.g., a Southbridge chip, receives user input from one or more user input devices 908 (e.g., keyboard, mouse, joystick, digitizer tablets, touch pads, touch screens, still or video cameras, motion sensors, and/or microphones) and forwards the input to CPU 702 via memory bridge 705.

A display processor 912 is coupled to the memory bridge 985 via a bus or other communication path (e.g., a PCI Express, Accelerated Graphics Port, or HyperTransport link); in one embodiment display processor 912 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 904.

Display processor 912 periodically delivers pixels of the dashboard to a display device 910 (e.g., a screen or conventional CRT, plasma, OLED, SED or LCD based monitor or television). Additionally, display processor 912 may output pixels to film recorders adapted to reproduce computer generated images on photographic film. Display processor 912 can provide display device 910 with an analog or digital signal.

Persistent storage 920 is also connected to I/O bridge 907 and may be configured to store content and applications and data, such as a database library 915, for use by CPU 902 and display processor 912. Persistent storage 920 provides non-volatile storage for applications and data and may include fixed or removable hard disk drives, flash memory devices, and CD-ROM, DVD-ROM, Blu-ray, HD-DVD, or other magnetic, optical, or solid state storage devices.

Illustratively, persistent storage 920 includes manufacturing data 990, which may comprise information acquired by the chamber matching analysis engine 222. Manufacturing data 990 may, for example, comprise information received from MES 232, collected by the manufacturing tool 101, related to various sensors taking measurements from substrates and tools over time during the manufacturing processes.

A switch 916 provides connections between the I/O bridge 907 and other components such as a network adapter 918 and various add-in cards 920 and 921. Network adapter 918 allows the system 900 to communicate with other systems via an electronic communications network, and may include wired or wireless communication over local area networks 940 and wide area networks such as the Internet.

Other components (not shown), including USB or other port connections, film recording devices, or other suitable computing device, may also be connected to I/O bridge 907. For example, process equipment 970 may operate from instructions and/or data provided by CPU 902, system memory 904, or persistent storage 920. Communication paths interconnecting the various components in FIG. 9 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

The process equipment 970 may be one or more semiconductor chambers such as a plasma enhanced chemical vapor deposition (PECVD) or other plasma processing chamber, such as the processing tools contained in the manufacturing tool 101. For example, process equipment 970 may be an etch chamber, a chemical vapor deposition chamber, a physical vapor deposition chamber, an implant chamber, a plasma treatment chamber, or other plasma processing chamber, either alone or in combination with one or more other chambers.

In one embodiment, display processor 912 incorporates circuitry optimized for performing mathematical operations, including, for example, math co-processor, and may additionally constitute a graphics processing unit (GPU). In another embodiment, display processor 912 incorporates circuitry optimized for general purpose processing. In yet another embodiment, display processor 912 may be integrated with one or more other system elements, such as the memory bridge 905, CPU 702, and I/O bridge 907 to form a system on chip (SoC). In still further embodiments, display processor 912 is omitted and software executed by CPU 902 performs the functions of display processor 912.

Pixel data can be provided to display processor 912 directly from CPU 902. In some embodiments, instructions and/or data representing an anomaly verification analysis is provided to set of server computers, each similar to the system 900, via network adapter 918 or system disk 914. The servers may perform operations on subsets of the data using the provided instructions for analysis. The results from these operations may be stored on computer-readable media in a digital format and optionally returned to the system 900 for further analysis or display. Similarly, data may be output to other systems for display, stored in a database library 915 on the system disk 914, or stored on computer-readable media in a digital format.

Alternatively, CPU 902 provides display processor 912 with data and/or instructions defining the desired output images, from which display processor 912 generates the pixel data of one or more output images, including characterizing and/or adjusting the offset between stereo image pairs. The data and/or instructions defining the desired output images can be stored in system memory 904 or graphics memory within display processor 912. CPU 902 and/or display processor 912 can employ any mathematical, function or technique known in the art to create one or more results from the provided data and instructions, including running models and comparing data from sensors to track the service life of chamber components.

It will be appreciated that the system shown herein is illustrative and that variations and modifications are possible. The connection topology, including the number and arrangement of bridges, may be modified as desired. For instance, in some embodiments, system memory 904 is connected to CPU 902 directly rather than through a bridge, and other devices communicate with system memory 904 via memory bridge 905 and CPU 902. In other alternative topologies display processor 912 is connected to I/O bridge 907 or directly to CPU 902, rather than to memory bridge 905. In still other embodiments, I/O bridge 907 and memory bridge 905 might be integrated into a single chip. The particular components shown herein are optional; for instance, any number of add-in cards or peripheral devices might be supported. In some embodiments, the process equipment 970 may be connected directly to the I/O bridge 907. In some embodiments, the switch 916 is eliminated, and the network adapter 918 and the add-in cards 920, 921 connect directly to the I/O bridge 907.

Various embodiments of the invention may be implemented as a program product for use with a computer system. The software routines of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

Any combination of one or more computer readable medium(s) may be utilized for storing a program product which, when executed, is configured to perform method for determining the service life of a chamber components. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of the present invention may be written in any combination of one or more programming languages, including an object oriented programming language such as JAVA™, SMALLTALK™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operations to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Embodiments of the invention may be provided to end users through a cloud computing infrastructure. Cloud computing refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Advantageously, the techniques presented herein allow for real-time anomaly detection, off-line problem diagnosis, and chamber matching. With respect to real-time anomaly detection, embodiments train a model beforehand, and real time detects whether there is a large deviation from a good trace and whether to make a correction accordingly. With respect to off-line problem diagnosis, when certain problem happens during a marathon of runs, embodiments use good runs to train a model and check the difference of a bad run compared to the good run. This determines the top contributor sensors of the difference to help diagnose what is the real problem in either hardware or the process itself (e.g., a flow valve, power strike delayed, etc.). With respect to chamber matching, embodiments permit training the model with multiple runs from one/multiple good chambers, and checking differences in output data from a good chamber but coming from a bad chamber. As stated above, the autoencoder will ignore the baseline difference between good chambers, and focus on finding the more important differences (e.g., pattern, process, etc.). This is more efficient than conventional methods for chamber matching that run the same/similar recipe.

The techniques allow for intelligent predictions of substrate quality based on manufacturing data, and allow for efficient decisions to be made regarding corrective actions to be taken with respect to individual substrates and other aspects of the manufacturing process. Use of embodiments of the present disclosure may reduce costs, improve efficiency, and allow for better strategic planning with respect to the manufacturing process.

As will be appreciated by one of ordinary skill in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may be referred to herein as a "circuit," "module" or "system." Furthermore, aspects of the present invention may take the form of a computer program product embodied in one or more computer readable medium(s) having computer readable program code embodied thereon.

In the preceding, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present disclosure, other and further embodiments of the disclosure may be devised without departing from the basic scope thereof, and the scope thereof is determined by the claims that follow.

What is claimed is:

1. A method for matching processing chambers that process a semiconductor substrate, the method comprising:
   training a neural network by feeding a first set of input time-series data of one or more sensors of a first processing chamber that is within specification to the neural network to produce a corresponding first set of output time-series data;
   calculating a first error between the first set of input time-series data and the corresponding first set of output time-series data;
   feeding a second set of input time-series data from corresponding one or more sensors associated with a second processing chamber under test to the trained neural network to produce a corresponding second set of output time-series data;
   calculating a second error between the second set of input time-series data and the corresponding second set of output time-series data; and
   responsive to a difference between the second error and the first error being equal to or exceeding a threshold amount, declaring that the second processing chamber under test mismatches the first processing chamber that is within specifications.

2. The method of claim 1, wherein, responsive to the difference between the second error and the first error being below the threshold amount, declaring that the second processing chamber under test matches the first processing chamber that is within specifications.

3. The method of claim 1, wherein the first processing chamber and the second processing chamber are of a first type, and further comprising a third processing chamber under test of the first type, the method further comprising:
   feeding a third set of input time-series data from corresponding one or more sensors associated with the third processing chamber under test to the trained neural network to produce a corresponding third set of output time-series data;

calculating a third error between the third set of input time-series data and the corresponding third set of output time-series data; and responsive to a difference between a sum of the second error and the third error, and the first error being equal to or exceeding a second threshold amount, declaring that the second processing chamber under test and the third processing chamber under test mismatch the first processing chamber that is within specifications.

4. The method of claim 3, wherein, responsive to the difference between the sum of the second error and the third error, and the first error falling below the second threshold amount, declaring that the second processing chamber under test and the third processing chamber under test match the first processing chamber that is within specifications.

5. The method of claim 1, wherein the first processing chamber and the second processing chamber are of a first type, further comprising a third processing chamber that is within specifications that is of a second type and a fourth processing chamber under test that is of the second type, the method further comprising:

feeding a third set of input time-series data of one or more sensors of the third processing chamber that is within specification to the neural network to produce a corresponding third set of trained output time-series data;

calculating a third error between the third set of input time-series data and the corresponding third set of trained output time-series data;

feeding a fourth set of input time-series data from corresponding one or more sensors associated with the fourth processing chamber under test to the trained neural network to produce a corresponding fourth set of output time-series data;

calculating a fourth error between the fourth set of input time-series data and the corresponding fourth set of output time-series data; and responsive to a difference between a first sum of the second error and the fourth error, and a second sum of the first error and the third error being equal to or exceeding a second threshold amount, declaring that the second processing chamber under test and the fourth processing chamber under test mismatch the first processing chamber that is within specifications and the third processing chamber that is within specifications.

6. The method of claim 5, wherein, responsive to the difference between the first sum of the second error and the fourth error, and the second sum of the first error and the third error falling below the second threshold amount, declaring that the second processing chamber under test and the fourth processing chamber under test match the first processing chamber that is within specifications and the third processing chamber that is within specifications, respectively.

7. The method of claim 1, further comprising causing a corrective action to occur responsive to declaring a mismatch of chambers.

8. The method of claim 1, wherein the neural network minimizes reconstruction error.

9. The method of claim 1, wherein the first error and the second error are mean square errors.

10. The method of claim 1, wherein minimizing reconstruction error minimizes mean square error between a set of input time-series data fed to the neural network and the corresponding set of time-series data output by the neural network.

11. A computing system, comprising:
a memory; and
a processor configured to perform a method for matching processing chambers that process a semiconductor substrate, the method comprising:

training a neural network by feeding a first set of input time-series data of one or more sensors of a first processing chamber that is within specification to the neural network to produce a corresponding first set of output time-series data;

calculating a first error between the first set of input time-series data and the corresponding first set of output time-series data;

feeding a second set of input time-series data from corresponding one or more sensors associated with a second processing chamber under test to the trained neural network to produce a corresponding second set of output time-series data;

calculating a second error between the second set of input time-series data and the corresponding second set of output time-series data; and responsive to a difference between the second error and the first error being equal to or exceeding a threshold amount, declaring that the second processing chamber under test mismatches the first processing chamber that is within specifications.

12. The system of claim 11, wherein, responsive to the difference between the second error and the first error being below the threshold amount, declaring that the second processing chamber under test matches the first processing chamber that is within specifications.

13. The system of claim 11, wherein the first processing chamber and the second are of a first type, and further comprising a third processing chamber under test of the first type, the method further comprising:

feeding a third set of input time-series data from corresponding one or more sensors associated with the third processing chamber under test to the trained neural network to produce a corresponding third set of output time-series data;

calculating a third error between the third set of input time-series data and the corresponding third set of output time-series data; and responsive to a difference between a sum of the second error and the third error, and the first error being equal to or exceeding a second threshold amount, declaring that the second processing chamber under test and the third processing chamber under test mismatch the first processing chamber that is within specifications.

14. The system of claim 11, wherein the first processing chamber and the second processing chamber are of a first type, further comprising a third processing chamber that is within specifications that is of a second type and a fourth processing chamber under test that of the second type, the method further comprising:

feeding a third set of input time-series data of one or more sensors of the third processing chamber that is within specification to the neural network to produce a corresponding third set of trained output time-series data;

calculating a third error between the third set of input time-series data and the corresponding third set of trained output time-series data;

feeding a fourth set of input time-series data from corresponding one or more sensors associated with the fourth processing chamber under test to the trained neural network to produce a corresponding fourth set of output time-series data;

calculating a fourth error between the fourth set of input time-series data and the corresponding fourth set of output time-series data; and responsive to a difference between a first sum of the second error and the fourth error, and a second sum of the first error and the third error being equal to or exceeding a second threshold amount, declaring that the second processing chamber under test and the fourth processing chamber under test mismatch the first processing chamber that is within specifications and the third processing chamber that is within specifications.

15. The method of claim 14, wherein, responsive to the difference between the first sum of the second error and the fourth error, and the second sum of the first error and the third error falling below the second threshold amount, declaring that the second processing chamber under test and the fourth processing chamber under test match the first processing chamber that is within specifications and the third processing chamber that is within specifications, respectively.

16. A non-transitory computer-readable medium comprising instructions that when executed by a computing device cause the computing device to perform a method for matching processing chambers that process a semiconductor substrate, the method comprising:

training a neural network by feeding a first set of input time-series data of one or more sensors of a first processing chamber that is within specification to the neural network to produce a corresponding first set of output time-series data;

calculating a first error between the first set of input time-series data and the corresponding first set of output time-series data; feeding a second set of input time-series data from corresponding one or more sensors associated with a second processing chamber under test to the trained neural network to produce a corresponding second set of output time-series data;

feeding a second set of input time-series data from corresponding one or more sensors associated with a second processing chamber under test to the trained neural network to produce a corresponding second set of output time-series data;

calculating a second error between the second set of input time-series data and the corresponding second set of output time-series data; and responsive to a difference between the second error and the first error being equal to or exceeding a threshold amount, declaring that the second processing chamber under test mismatches the first processing chamber that is within specifications.

17. The non-transitory computer-readable medium of claim 16, wherein, responsive to the difference between the second error and the first error being below the threshold amount, declaring that the second processing chamber under test matches the first processing chamber that is within specifications.

18. The non-transitory computer-readable medium of claim 16, wherein the first processing chamber and the second are of a first type, and further comprising a third processing chamber under test of the first type, the method further comprising:

feeding a third set of input time-series data from corresponding one or more sensors associated with the third processing chamber under test to the trained neural network to produce a corresponding third set of output time-series data;

calculating a third error between the third set of input time-series data and the corresponding third set of output time-series data; and responsive to a difference between a sum of the second error and the third error, and the first error being equal to or exceeding a second threshold amount, declaring that the second processing chamber under test and the third processing chamber under test mismatch the first processing chamber that is within specifications.

19. The non-transitory computer-readable medium of claim 16, wherein the first processing chamber and the second processing chamber are of a first type, further comprising a third processing chamber that is within specifications that is of a second type and a fourth processing chamber under test that of the second type, the method further comprising:

feeding a third set of input time-series data of one or more sensors of the third processing chamber that is within specification to the neural network to produce a corresponding third set of trained output time-series data;

calculating a third error between the third set of input time-series data and the corresponding third set of trained output time-series data;

feeding a fourth set of input time-series data from corresponding one or more sensors associated with the fourth processing chamber under test to the trained neural network to produce a corresponding fourth set of output time-series data;

calculating a fourth error between the fourth set of input time-series data and the corresponding fourth set of output time-series data; and responsive to a difference between a first sum of the second error and the fourth error, and a second sum of the first error and the third error being equal to or exceeding a second threshold amount, declaring that the second processing chamber under test and the fourth processing chamber under test mismatch the first processing chamber that is within specifications and the third processing chamber that is within specifications.

20. The non-transitory computer-readable medium of claim 16, further comprising causing a corrective action to occur responsive to declaring a mismatch of chambers.

* * * * *